(12) United States Patent
Choi et al.

(10) Patent No.: US 6,522,597 B2
(45) Date of Patent: Feb. 18, 2003

(54) SEMICONDUCTOR MEMORY DEVICE AND BIT LINE ISOLATION GATE ARRANGEMENT METHOD THEREOF

(75) Inventors: Jong Hyun Choi, Suwon (KR); Sang Seok Kang, Suwon (KR); Jae Hoon Joo, Youngin (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/947,392

(22) Filed: Sep. 7, 2001

(65) Prior Publication Data

US 2002/0039320 A1 Apr. 4, 2002

(30) Foreign Application Priority Data

Sep. 25, 2000  (KR) ......................................... 2000-56248

(51) Int. Cl.⁷ ................................................. G11C 8/00
(52) U.S. Cl. .................................. 365/230.03; 365/203
(58) Field of Search ............................. 365/203, 230.03

(56) References Cited

U.S. PATENT DOCUMENTS 5,748,556 A * 5/1998 Iyengar .................. 365/230.06
5,940,329 A * 8/1999 Seitsinger et al. ...... 365/189.05
6,140,834 A * 10/2000 Takahashi ..................... 326/21

* cited by examiner

*Primary Examiner*—M. Tran
(74) *Attorney, Agent, or Firm*—Lee & Sterba, P.C.

(57) ABSTRACT

State change transition times of a semiconductor memory device is reduced by reducing contact resistance associated with unshared input/output (I/O) lines. To minimize the difference in transition times between shared I/O lines having dual precharging circuits and non-shared I/O lines which have only a single precharging circuit, effective contact resistance of the non-shared I/O lines are reduced by eliminating unnecessary isolation gates with their attendant impedances. This provides faster transition times for the non-shared I/O lines.

8 Claims, 3 Drawing Sheets

SEMICONDUCTOR MEMORY DEVICE AND BIT LINE ISOLATION GATE ARRANGEMENT METHOD THEREOF

BACKGROUND OF THE INVENTION

Korean Application Number 2000-56248 filed Sep. 25, 2000, entitled "Semiconductor memory device and bit line isolation gate arrangement method thereof," is incorporated herein by reference in its entirety.

1. Field of the Invention

The present invention relates to isolation gate arrangement in semiconductor memory devices, and more particularly, to a bit line isolation gate arrangement for reducing bit line precharge time.

2. Background of the Invention

In conventional high-density semiconductor memory devices, such as dynamic random access memories (DRAMs), in order to reduce power consumption, a memory cell array is often partitioned into multiple memory cell array blocks, wherein each memory cell array block can be selectively enabled. Typically, the memory cell array blocks remain in an inactive, low-power state until access to an individual cell is desired.

To access a cell, only the associated memory cell array block is activated via control lines. Typically, these control lines include block, row, and column addressing lines. The operational control sequencing needed to transfer data in and out of the addressed cell is accomplished using a pair of conductor lines arranged as "bit line pairs." A first bit line pair controls an input stage of the memory cell, and a second bit line pair controls an output stage of that cell. These bit line pairs are further connectively coupled to the multiple memory cell array blocks throughout the array. By selectively activating the line pairs, data transfers can be made between the memory cell and an external data bus.

A significant disadvantage of such an arrangement is that in the fabrication of the device, regional anomalies in the device are produced due to process variations. This can be manifested as differences in contact resistance from one side of an integrated circuit to the other. Coupled with intrinsic capacitances associated with integrated components making up the device, a node having higher contact resistance will be characterized by a longer charge time than a node having a lower contact resistance. This variation in the speed of state transitions significantly degrades the performance of the DRAM.

Accordingly, "precharge" lines are connected to nodes where additional charge would be required to speed up voltage transitions associated with such data bit state changes in each memory cell array block. In conventional configurations, portions of these memory cell array block pre-charge lines are connected to internal semiconductor components of the memory cell array block, and other portions are connected to input/output (I/O) buffering components located at block boundaries of the memory cell array block. Since these buffering components of each memory cell array block are each connected to a universal external I/O buffer in the DRAM device, the I/O buffer portions of the precharge lines are in turn universally connected to the I/O buffering components of the other memory cell array blocks in the DRAM device. Thus, I/O buffering devices on these "shared" lines are subjected to a collective pre-charge that is significantly greater than the pre-charge available to device nodes that are internal to the memory cell array block boundaries and which are connected to only a single pre-charge line. This causes mismatches in the transition times of the semiconductor devices located within an internal memory cell array block "chain" as compared to the I/O component regions, again with attendant degradation of the DRAM device. There is an obvious need for an improved structure that will provide for more uniform transition times and less dependency on contact resistance of the devices.

SUMMARY OF THE INVENTION

In a preferred embodiment of the present invention, state change transition times of a semiconductor memory device are reduced by reducing contact resistance associated with unshared input/output (I/O) lines. To minimize the difference in transition times between shared I/O lines having dual precharge circuits and non-shared I/O lines which have only a single precharge circuit, effective contact resistance of the non-shared I/O lines are reduced through the elimination of unnecessary isolation gates with their attendant impedances. This provides faster transition times for the non-shared I/O lines.

As claimed in a feature of an embodiment of the present invention, there is provided an integrated semiconductor memory device comprising a plurality of memory cell array blocks, each memory cell array block having an input port and an output port and further comprising a plurality of memory cells, an input amplifying means for amplifying a received data signal, an output amplifying means for amplifying a stored data signal, a first precharging means which is electrically associated with the input port, and a second precharging means which is electrically associated with the output port, a first plurality of differential conductor pairs, each pair of conductor pairs being associated with a single data bit and being electrically associated with an input port of one of the plurality of memory cell array blocks, a second plurality of differential conductor pairs, each pair being associated with a single data bit and each pair being electrically associated with an output port of one of the plurality of memory cell array blocks, a plurality of isolation components, each one switchably isolating an input port of a first memory cell array block from an output port of a second memory cell array block when the two memory cell array blocks are electrically coupled; and characterized in that the two ports are further isolated from an associated differential conductor pair, and an address decoding means for selectively enabling a memory cell array block in the plurality of memory cell array blocks in response to a unique address signal, wherein at least two of the plurality of memory cell array blocks, which are not connectively coupled to an adjacent memory cell array block, have a port that is directly connected to an input/output conductor.

As claimed in another feature of an embodiment of the present invention, the first precharging means comprises a switchable energy source that is electrically associated with each one of the input ports of the memory cell array block. The first precharging means may provide a predetermined quantity of charge to a plurality of intrinsic capacitances that are associated with the respective ports in order to increase the speed of voltage transitions at the ports. The second precharging means may comprise a switchable energy source that is electrically associated with each one of the input ports of the memory cell array block. The second precharging means may also provide a predetermined quantity of charge to a plurality of intrinsic capacitances that are associated with the respective ports in order to increase the speed of voltage transitions at the ports.

As claimed in another feature of an embodiment of the present invention, there is provided an integrated semiconductor memory device comprising a first memory cell array block having a plurality of control lines and a first pair of conductors that directly and electrically connect the first memory cell array block to a first node, a first precharging circuit electrically connected to the first pair of conductors, a second pair of conductors that electrically connect the first memory cell array block to a second node using a first isolation component, a second precharging circuit electrically connected to the second pair of conductors, a second memory cell array block that is electrically connected to the second node using a second isolation component, and a third precharging circuit electrically connecting the second memory cell array block to the second isolation component. A first sense amplifier may be operationally coupled to the first node, and a second sense amplifier may be operationally connected to the second node. The first conductor pair may be operated without an isolation circuit being placed between the first node and the first memory cell array block. The integrated semiconductor memory device may further comprise at least a first pair of non-shared bit line conductors and at least a first pair of shared bit line conductors. The first conductor pair may be operated without an isolation circuit being placed between the first node and the first memory cell array block.

These and other features of the present invention will be readily apparent to those of ordinary skill in the art upon review of the detailed description that follows.

BRIEF DESCRIPTION OF THE DRAWINGS

The novel features believed characteristic of the invention are set forth in the appended claims. The invention itself, however, as well as preferred modes of use, further objects, and advantages thereof, will best be understood by reference to the following detailed description of illustrative embodiments when read in conjunction with the accompanying drawings, wherein:

DESCRIPTION OF THE PREFERRED EMBODIMENTS

The present invention will now be described more fully hereinafter with reference to the accompanying drawings, in which preferred embodiments of the invention are shown. This invention may, however, be modified in different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

The following discussion will encompass a single memory cell, which provides storage for a single data bit. For typical applications having other data widths (i.e. multiple data bits), such as bytes, words, etc., an appropriate number of identical cells would ordinarily be grouped together and operated on simultaneously using identical processes. Further, the exemplary component and control line configurations incorporated are representative only and are not meant to be restrictive on the scope of the invention.

Figure 1:
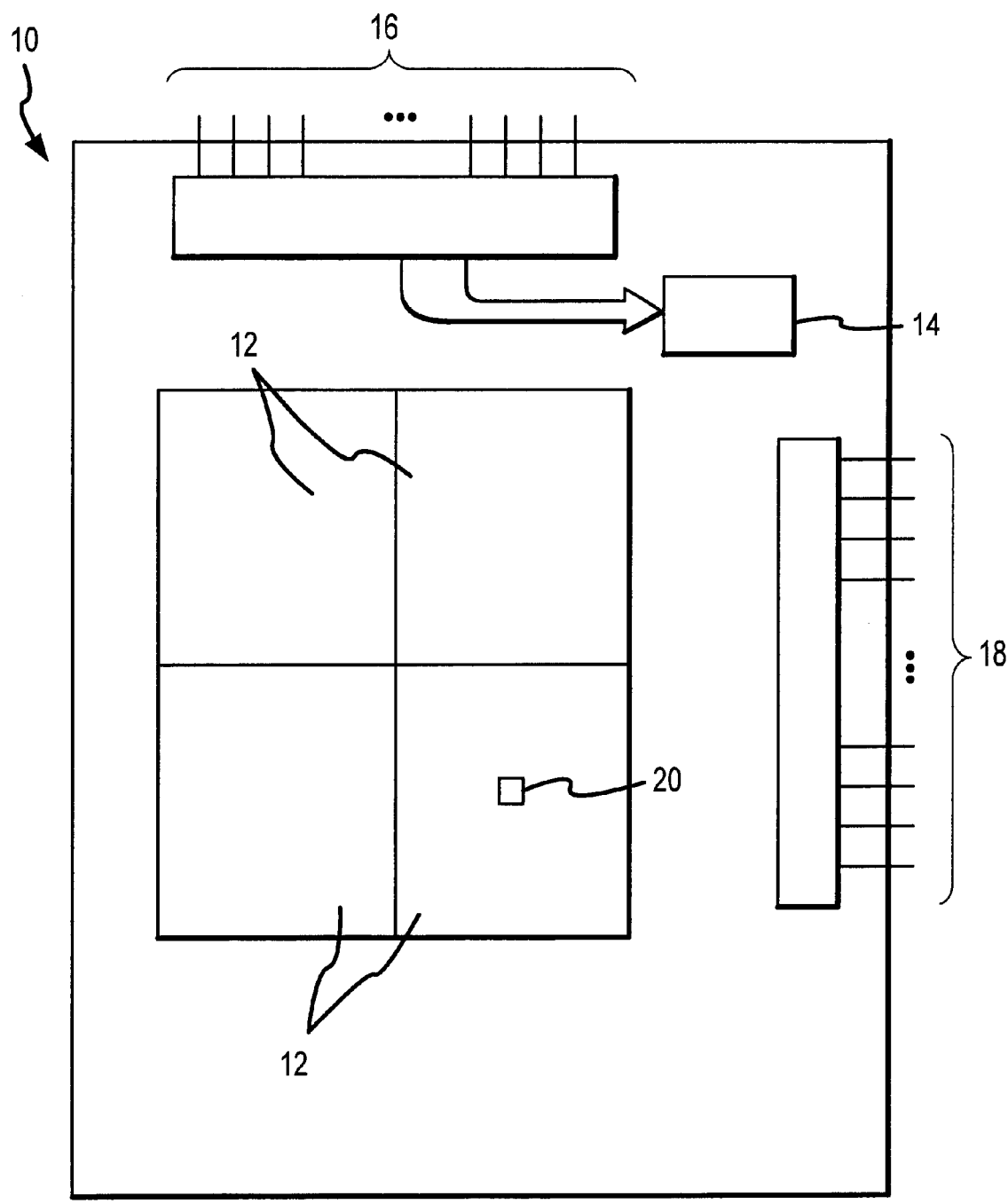
FIG. 1 illustrates a block diagram of an arrangement of a conventional semiconductor memory device.

FIG. 1 shows a block diagram of an arrangement of a conventional semiconductor memory device 10. Memory device 10 includes a memory cell array, which are partitioned into memory cell array blocks 12, which can be selectively enabled via a decoder 14 of address lines 16. Although four memory cell array blocks 12 are shown as an example in FIG. 1, the actual number of partitions can vary widely depending on the size and organization of memory device 10. Associated with each one of the memory cell array blocks 12 are a set of electrical control lines and circuit components for phase and sequence control that provide for the orderly transfer and storage of data between an external data bus 18 and a particular memory cell 20 located in a selected memory cell array block 12.

Figure 2:
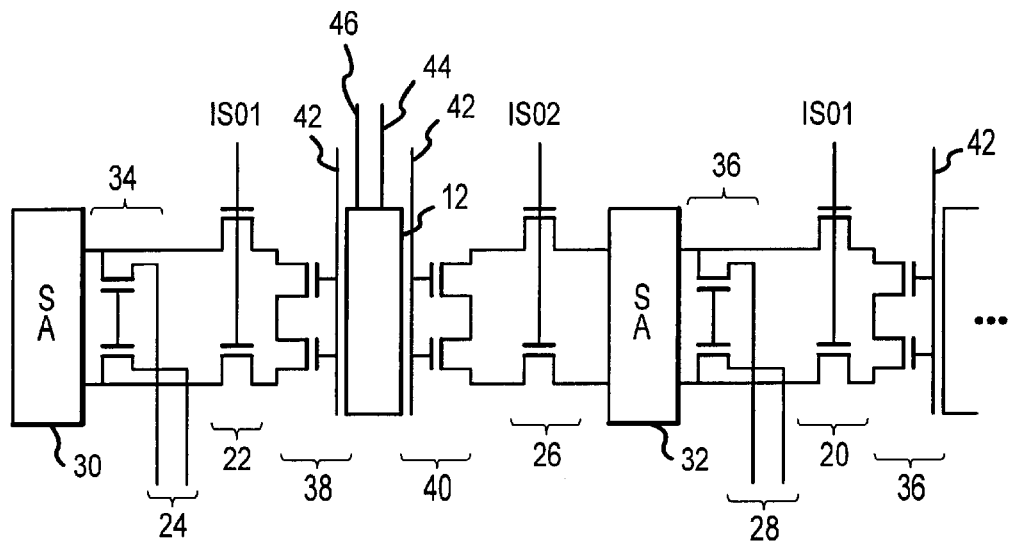
FIG. 2 illustrates an exemplary circuit diagram showing the control elements for a memory cell array block of the memory device shown in FIG. 1.

FIG. 2 shows an exemplary circuit diagram showing the control elements for a memory cell array block 12 of the conventional memory device shown in FIG. 1. The control elements could include a first input/output (I/O) isolation buffer 22 between conductive data bit line pair 24 and memory cell array block 12 and a second I/O isolation buffer 26 between a second data bit line pair 28 and an opposite side of memory cell array block 12. A sense amplifier (SA) 30 is associated with bit line pair 24 for amplifying data signals that are present on the line pair. Similarly, SA 32 amplifies signals that are present on bit line pair 28. As is known in the art, data control lines 24 and 28 are typically arranged in differential pairs in low voltage memory devices 10 for improved noise immunity, and isolation buffers 22 ands 26 insulate the cells of memory cell array block 12 from data activity on adjacent memory cell array block when memory cell array block 12 is not selected for a data transfer. Bit line gating circuits 34 and 36 control the actual transfer between each bit line pair 24 and 28, respectively, and the above circuit nodes.

To enhance transition speeds during data state changes in cell 20, prior to a read/write strobing operation, I/O nodes in memory cell array block 12 are "precharged" to a voltage that is half the maximum logical voltage, thereby conditioning the line such that only a remaining 50% transition with an attendant 50% transition time improvement will be needed at the strobing time. Precharge circuits 38 and 40 under control of a common precharge signal 42 provide this charging activity for memory cell array block 12. At the end of a predetermined precharge time, data that is present at the input of memory cell array block 12 is transferred into memory cell array block 12 via a pulse on Write strobe line 44. Alternatively, data in memory cell array block 12 would be read out of memory cell array block 12 upon application of a Read Enable/Cell Select line 46. Typically, most of the above control lines are activated whether a memory cell array block 12 is selected or not. Only the selection of the particular memory cell array block 12 will allow a data transfer with the memory cell array block 12.

Figure 3:
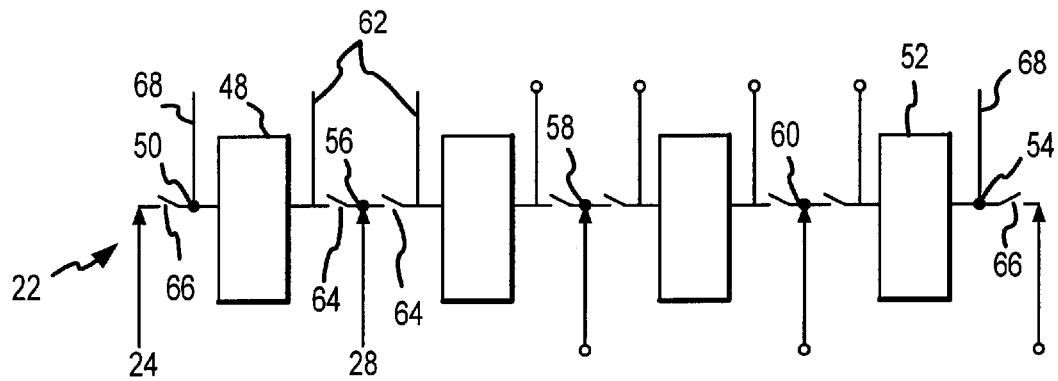
FIG. 3 illustrates a block diagram of a conventional memory device, which is partitioned into a multitude of memory cell array blocks having interconnecting nodes, wherein each node has precharge circuits and isolation devices.

Typically, to conserve chip real estate, adjacent memory cell array blocks 12 will share a common I/O bit line gating circuit and a common sense amplifier. Such an arrangement leads to a connection structure wherein some "shared" nodes can receive precharge from both an intrinsic precharge circuit and an adjacent precharge circuit located on the other side of the common sense amplifier, while other "un-shared"

nodes only receive only a single precharge. This difference in the effective "contact impedance" of the different nodes can cause a halving in the transition times of the shared nodes relative to that of an un-shared node. This compromises the overall dynamic storage operation of memory device 10, since the device 10 cannot be operated faster than its slowest component, FIG. 3 shows a block diagram of a conventional memory device 10, which is partitioned into a multitude of memory cell array blocks having interconnecting nodes, wherein each node has precharge circuits and isolation devices. For an exemplary partitioning of a memory array into four memory cell array blocks, a first memory cell array block 48 having an unshared arrangement of an I/O node 50 may be configured as an input port, and a last memory cell array block 52 having an unshared arrangement of an I/O node 54 may be configured as an output port. The remaining interconnection nodes 56, 58, and 60 may all have a shared configuration. To better understand the present invention, SA devices are not shown in the diagram shown in FIG. 3, isolation switches associated with each node are shown as simple switch elements, and the bit line pairs are shown as the vertical arrow connecting to the node.

Each of the shared nodes 56, 58, and 60 have two precharge circuits 62 and two isolation circuits 64 associated with them, while each of the unshared nodes 50 and 54 have a single associated isolation circuit 66 and a single precharge circuit 68. Thus, when all of the isolation circuits are in an "on" condition, shared nodes 56, 58, and 60 may have transition times that are twice as fast as the transition times of the unshared outer (i.e., first and last) nodes 50 and 54. The amount of difference in these transition times is a function of the amount of charge current provided by the individual precharge circuits and the product of the resistive and capacitive impedances that are associated with each node.

Figure 4:
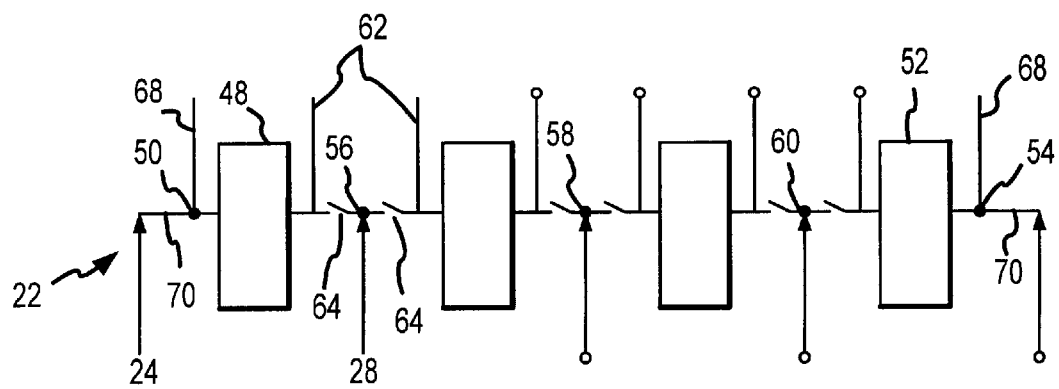
FIG. 4 illustrates a block diagram of a preferred embodiment of a semiconductor memory device as claimed in the present invention.

FIG. 4 shows a block diagram of a preferred embodiment of a semiconductor memory device as claimed in the present invention. In the preferred embodiment, the above transition time differences are effectively eliminated through the reduction in the contact resistance of outer nodes 50 and 54 to provide faster transition times for those nodes. This improvement comprises the designing of outer unshared nodes to be without isolation circuits and their associated resistances (i.e., isolation circuits 66 are replaced by a short circuit elements 70), since there are no adjacent memory cell array blocks at these nodes to necessitate such isolation circuits.

Figure 5:
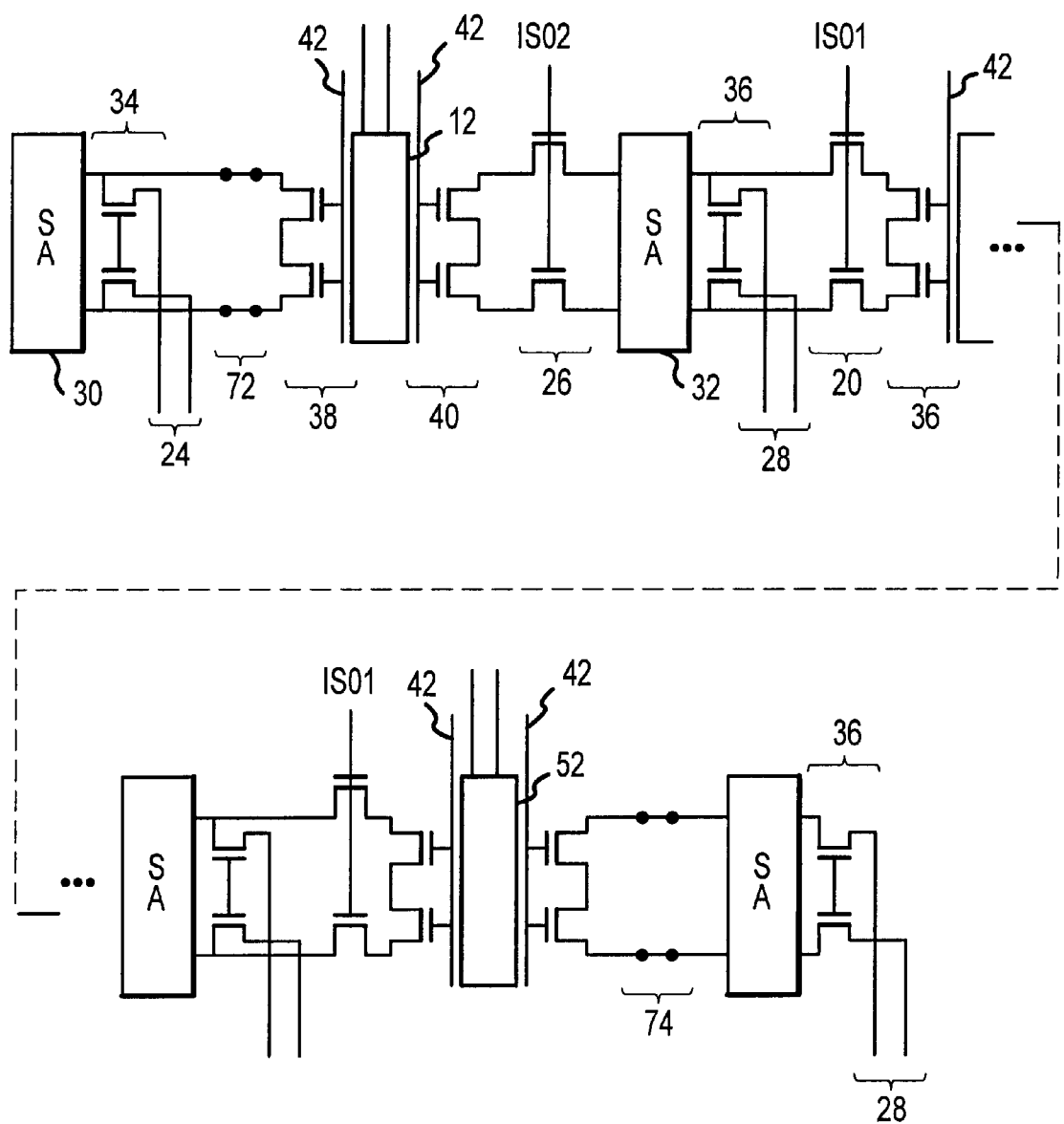
FIG. 5 illustrates a circuit diagram of a preferred embodiment of a semiconductor memory device as claimed in the present invention.

FIG. 5 shows a circuit diagram of a preferred embodiment of a semiconductor memory device as claimed in the present invention. This diagram has the same elements as the circuit diagram shown in FIG. 2 except that isolation circuit 22 associated with the un-shared node on the left side of memory cell array block 12 in FIG. 2 is replaced by short circuit elements 72, and the isolation circuit associated with the other un-shared node (not shown) that is associated with last memory cell array block 52 is replaced by short circuit elements 74.

The lower contact resistances 72 and 74 in combination with the single precharge circuits of unshared nodes 50 and 54 provide faster transition times that can approach the transition times of the shared nodes 56, 58, and 60 having the dual precharge circuits. This can significantly improve the overall performance of memory device 10. Further, added chip area previously used for unshared isolation devices can be made available to allow for either implementation of the memory device on a smaller chip or as a device having higher memory density.

The following will address exemplary steps that may be implemented to write or read memory device 10 as claimed in the present invention. A first step in an exemplary Write operation to memory device 10 comprises the activation of circuits of a particular memory cell array block 12 via an enable line from address decoder 16. A second step includes the conditioning of all logic rails within memory cell array block 12 via an application of a precharge signal 42 to precharge circuits 38 and 40 to charge the lines to generally a midpoint between the maximum and minimum voltage rails. A third step comprises enabling of a particular cell 20 or group of cells 20. A fourth step comprises the application of the data to line pair 24, with a write strobe 44 being applied to memory cell 20 to cause the data present on line pair 24 to be transferred into memory cell 20. After an appropriate data holding and settling time, all the control and data lines would be returned to an inactive state.

A similar sequence of events could be used for a Read operation on memory cell 20. After an identical first three exemplary steps, the fourth step would entail enabling a "read" circuit external to the selected memory cell array block 12, such that when a Read strobe 46 is applied to memory cell 20 and the external read circuit, the data bit that was being stored in memory cell 20 is transferred to the external read circuit. As above, after an appropriate data holding and settling time, all the control and data lines would be returned to an inactive state.

A preferred embodiment of the present invention has been disclosed herein and, although specific terms are employed, they are used in a generic and descriptive sense only and not for purpose of limitation. Accordingly, it will be understood by those of ordinary skill in the art that various changes in form and details may be made without departing from the spirit and scope of the invention as set forth in the following claims.

What is claimed is:

1. An integrated semiconductor memory device comprising:
   a plurality of memory cell array blocks, each memory cell array block having an input port and an output port and further comprising;
   a plurality of memory cells;
   an input amplifying means for amplifying a received data signal;
   an output amplifying means for amplifying a stored data signal;
   a first precharging means which is electrically associated with the input port; and
   a second precharging means which is electrically associated with the output port;
   a first plurality of differential conductor pairs, each pair of conductor pairs being associated with a single data bit and being electrically associated with an input port of one of the plurality of memory cell array blocks;
   a second plurality of differential conductor pairs, each pair being associated with a single data bit and each pair being electrically associated with an output port of one of the plurality of memory cell array blocks;
   a plurality of isolation components, each one switchably isolating an input port of a first memory cell array block from an output port of a second memory cell array block when the two memory cell array blocks are electrically coupled; and characterized in that the two ports are further isolated from an associated differential conductor pair; and an address decoding means for selectively enabling a memory cell array block in the plurality of memory cell array blocks in response to a unique address signal;

wherein at least two of the plurality of memory cell array blocks, which are not connectively coupled to an adjacent memory cell array block, have a port that is directly connected to an input/output conductor.

2. The integrated semiconductor memory device as claimed in claim 1, wherein the first precharging means comprises a switchable energy source that is electrically associated with each one of the input ports of the memory cell array block.

3. The integrated semiconductor memory device as claimed in claim 2, wherein the first precharging means provides a predetermined quantity of charge to a plurality of intrinsic capacitances that are associated with the respective ports in order to increase the speed of voltage transitions at the ports.

4. The integrated semiconductor memory device as claimed in claim 1, wherein the second precharging means comprises a switchable energy source that is electrically associated with each one of the input ports of the memory cell array block.

5. The integrated semiconductor memory device as claimed in claim 4, wherein the second precharging means provides a predetermined quantity of charge to a plurality of intrinsic capacitances that are associated with the respective ports in order to increase the speed of voltage transitions at the ports.

6. An integrated semiconductor memory device comprising:

a first memory cell array block having a plurality of control lines and a first pair of conductors that directly and electrically connect the first memory cell array block to a first node;

a first precharging circuit electrically connected to the first pair of conductors;

a second pair of conductors that electrically connect the first memory cell array block to a second node using a first isolation component;

a second precharging circuit electrically connected to the second pair of conductors;

a second memory cell array block that is electrically connected to the second node using a second isolation component;

a third precharging circuit electrically connecting the second memory cell array block to the second isolation component;

a first sense amplifier operationally coupled to the first node; and a second sense amplifier operationally connected to the second node, wherein the first conductor pair is operated without an isolation circuit being placed between the first node and the first memory cell array block.

7. An integrated semiconductor memory device comprising:

a first memory cell array block having a plurality of control lines and a first pair of conductors that directly and electrically connect the first memory cell array block to a first node;

a first precharging circuit electrically connected to the first pair of conductors;

a second pair of conductors that electrically connect the first memory cell array block to a second node using a first isolation component;

a second precharging circuit electrically connected to the second pair of conductors;

a second memory cell array block that is electrically connected to the second node using a second isolation component;

a third precharging circuit electrically connecting the second memory cell array block to the second isolation component and at least a first pair of non-shared bit line conductors and at least a first pair of shared bit line conductors.

8. The integrated semiconductor memory device as claimed in claim 7, wherein the first conductor pair is operated without an isolation circuit being placed between the first node and the first memory cell array block.

* * * * *